United States Patent
Kim et al.

(10) Patent No.: US 8,303,829 B2
(45) Date of Patent: Nov. 6, 2012

(54) METHOD OF FABRICATING AN APPARATUS OF FABRICATING AN FLAT PANEL DISPLAY DEVICE AND METHOD FOR FABRICATING FLAT PANEL DISPLAY DEVICE

(75) Inventors: Jin Wuk Kim, Uiwang-si (KR); Mi Kyung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1107 days.

(21) Appl. No.: 11/950,215

(22) Filed: Dec. 4, 2007

(65) Prior Publication Data
US 2009/0139960 A1 Jun. 4, 2009

(30) Foreign Application Priority Data
Dec. 4, 2006 (KR) .................. 10-2006-0121730

(51) Int. Cl.
B29D 11/00 (2006.01)
C03C 15/00 (2006.01)
C03C 25/68 (2006.01)

(52) U.S. Cl. ............... 216/24; 216/33; 216/54
(58) Field of Classification Search .............. 216/54
See application file for complete search history.

(56) References Cited

U.S. PATENT DOCUMENTS

| | | | |
|---|---|---|---|
| 2005/0084613 A1* | 4/2005 | wang et al. | 427/282 |
| 2006/0105487 A1* | 5/2006 | Kim | 438/35 |
| 2006/0290024 A1* | 12/2006 | Jo et al. | 264/219 |

OTHER PUBLICATIONS

McClelland et al, Nanoscale Patterning of magnetic islands by Imprint Lithography Using a Flexible Mold, Aug. 19, 2002, Applied Physics Letters, vol. 81 No. 8, pp. 1483-1485.*
Thanawala et al, Surface Modification fo Silicone Elastomer Using Perfluorinated Ether, 2000, Langmuir, Col. 16 No. 3, pp. 1256-1260.*
Vlachopoulou et al, A low temperature surface modification assisted method for bonding plastic substrates, Nov. 2008, Journal of Micromechanics and Microengineering, 19, pp. 1-6.*

* cited by examiner

Primary Examiner — Nadine G Norton
Assistant Examiner — Stephanie Duclair
(74) Attorney, Agent, or Firm — Brinks Hofer Gilson & Lione

(57) ABSTRACT

A method of fabricating an apparatus of fabricating a flat panel display device and method of fabricating flat panel display device is disclosed, which enables simplification of process by performing a patterning process without a photo process, the method for fabricating an apparatus of fabricating flat panel display device comprising, preparing a master mold including a thin film pattern, coating a liquid-type molding material including oligomer on the master mold, forming a soft mold including a groove provided with a pattern in a shape corresponding to the thin film pattern of the master mold and adhering the soft mold to a mold support plate, wherein the soft mold is adhered to the mold support plate by a covalent bonding in the interface between the oligomer and the mold support plate.

4 Claims, 8 Drawing Sheets

FIG. 10
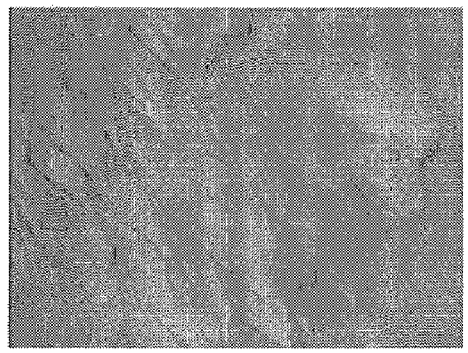
optical microscope photograph 1
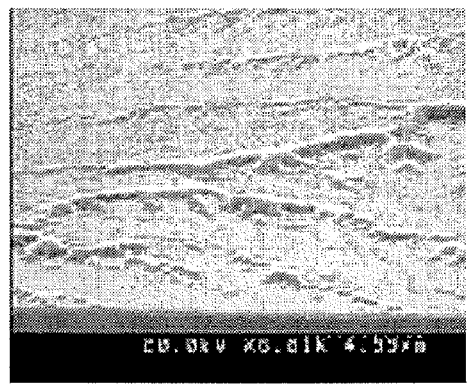
optical microscope photograph 2
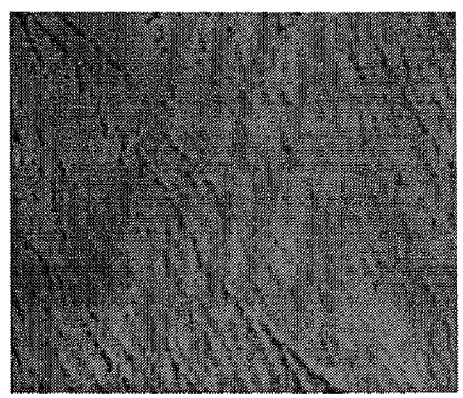
SEM(photograph)

US 8,303,829 B2

METHOD OF FABRICATING AN APPARATUS OF FABRICATING AN FLAT PANEL DISPLAY DEVICE AND METHOD FOR FABRICATING FLAT PANEL DISPLAY DEVICE

CLAIM FOR PRIORITY

This application claims the benefit of Korean Patent Application No. 10-2006-12730 filed Dec. 4, 2007, which is hereby incorporated by reference as if fully set forth herein.

BACKGROUND OF THE INVENTION

1. Field of the Invention

The present invention relates to a flat panel display device, and more particularly, to method for fabricating apparatus of fabricating flat panel display device and method for fabricating flat panel display device, which enables to carry out a patterning process without a photo process.

2. Discussion of the Related Art

In a recent information society, there is a great emphasis on display devices as visual information transmission medium. In case of cathode ray tubes CRTs which are used commonly in the recent information society, they have problems of high volume and weight. Examples of flat panel display devices are a liquid crystal display device LCD, a field emission display FED, a plasma display panel PDP, and an electroluminescence device EL, and the most of them have been put to practical use.

The LCD device can satisfy a recent trend in a marketing field of electronic device, that is, thin profile and light weight, and also can realize the mass production. In this respect, the LCD device substitutes for the CRT in wide application fields. Especially, an active-matrix type LCD device, which drives a liquid crystal cell by using a thin film transistor (hereinafter, referred to as "TFT"), has advantages of high picture quality and low power consumption. Owing to results of recently searched mass-production technology, the LCD device has been developed to large-size and high resolution device.

As shown in FIG. 1, the active-matrix type LCD device includes a color filter substrate 22 and a TFT array substrate 23 bonded to each other with a liquid crystal layer 15 formed therebetween. The active-matrix type LCD device shown in FIG. 1 illustrates some of an entire effective screen.

The color filter substrate 22 includes a color filter 13 and a common electrode 14 formed on a rear surface of an upper glass substrate 12. On the entire surface of the upper glass substrate 12, the color filter 13 includes red(R), green(G) and blue(B) color filters which transmit light of corresponding wavelength bands, to thereby enable to display colors. Although not shown, a black matrix is positioned between each of the adjacent color filters 13.

The TFT array substrate 23 includes a plurality of gate lines 18 and data lines 19 formed on an entire surface of a lower glass substrate 16, wherein each gate line 18 is formed in perpendicular to each data line 19. At this time, thin film transistors 20 are formed at every crossing of the gate and data lines 18 and 19. On the entire surface of the lower glass substrate 16, a pixel electrode 21 is formed in each cell region defined by the gate and data lines 18 and 19. The thin film transistor 20 switches a data transmission pass between the data line 19 and the pixel electrode 21 in response to a scanning signal from the gate line 18, to thereby drive the pixel electrode 21. A polarizing plate 17 is attached to the rear surface of the TFT array substrate 23. Also, the liquid crystal layer 15 controls the amount of incident light passing through the TFT array substrate 23 by an electric field applied.

The polarizing plates 11 and 17 attached to the color filter substrate 22 and the TFT array substrate 23 transmit the light polarized toward any one direction. When the liquid crystal layer 15 is in 90° TN mode, the polarizing directions of the polarizing plates 11 and 17 are perpendicular to each other. Although not shown, alignment films are formed on the liquid crystal facing surfaces of the color filter substrate 22 and the TFT array substrate 23.

A process for fabricating the active-matrix type LCD device includes a substrate cleaning step, a substrate patterning step, an alignment film forming and rubbing step, a substrate bonding and liquid crystal injecting step, a mounting step, a test step, and a repair step. At this time, the substrate cleaning step removes foreign matters from the surface of substrate by using a cleaner. The substrate patterning step includes patterning the color filter substrate and patterning the TFT array substrate. The alignment film forming and rubbing step includes coating the alignment film on each of the color filter substrate and the TFT array substrate, and rubbing the coated alignment film by a rubbing cloth. The substrate bonding and liquid crystal injecting step includes bonding the color filter substrate and the TFT array substrate to each other by using a sealant, providing spacers between the two substrates, injecting liquid crystal to a space between the two substrates through an inlet, and sealing the inlet. The mounting step includes connecting a tape carrier package (hereinafter, referred to as "TCP") on which a gate drive integrated circuit and a data drive integrated circuit are mounted to a pad region of the substrate. The drive integrated circuit may be directly mounted on the substrate by Chip On Glass (hereinafter, referred to as "COG"), instead of Tape Automated Bonding using the aforementioned TCP. The test step includes an electrical test performed after forming the pixel electrodes and signal lines such as the gate and data lines on the TFT array substrate, and an electrical test and macrography performed after the substrate bonding and liquid crystal injecting step. The repair step performs the repair for the substrate which is judged to be reparable by the test step. If it is impossible to repair the substrates, they are discarded.

When fabricating the various flat panel display devices as well as the LCD device, a thin film material deposited on a substrate is patterned by photolithography. The photolithography includes steps of photoresist coating, mask alignment, exposure, development and cleaning. However, the photolithography requires a long period of time, and causes the lost of photo-resist material and stripping liquid. Also, it is necessary for the photolithography to use a high-priced exposure apparatus.

SUMMARY OF THE INVENTION

Accordingly, the present invention is directed to an method for fabricating apparatus of fabricating flat panel display device and method for fabricating flat panel display device that substantially obviates one or more problems due to limitations and disadvantages of the related art.

An object of the present invention is to provide a method for fabricating apparatus of fabricating flat panel display device and method for fabricating flat panel display device, which enables simplification of process by performing a patterning process without a photo process.

Another object of the present invention is to provide a method for fabricating apparatus of fabricating flat panel display device and method for fabricating flat panel display device, which can simplify the process and reduce the fabrication cost.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating apparatus of fabricating flat panel display device comprises preparing a master mold including a thin film pattern; coating a liquid-type molding material including oligomer on the master mold; forming a soft mold including a groove provided with a pattern in a shape corresponding to the thin film pattern of the master mold; and adhering the soft mold to a mold support plate, wherein the soft mold is adhered to the mold support plate by a covalent bonding in the interface between the oligomer and the mold support plate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 10 illustrates a photograph showing PDMS and oligomor which spread to the mold support plate after separating the mold support plate from the soft mold.

DETAILED DESCRIPTION OF INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an apparatus and method of fabricating a flat panel display device according to the preferred embodiment of the present invention will be explained with reference to FIGS. 2 to 10.

Figure 1:
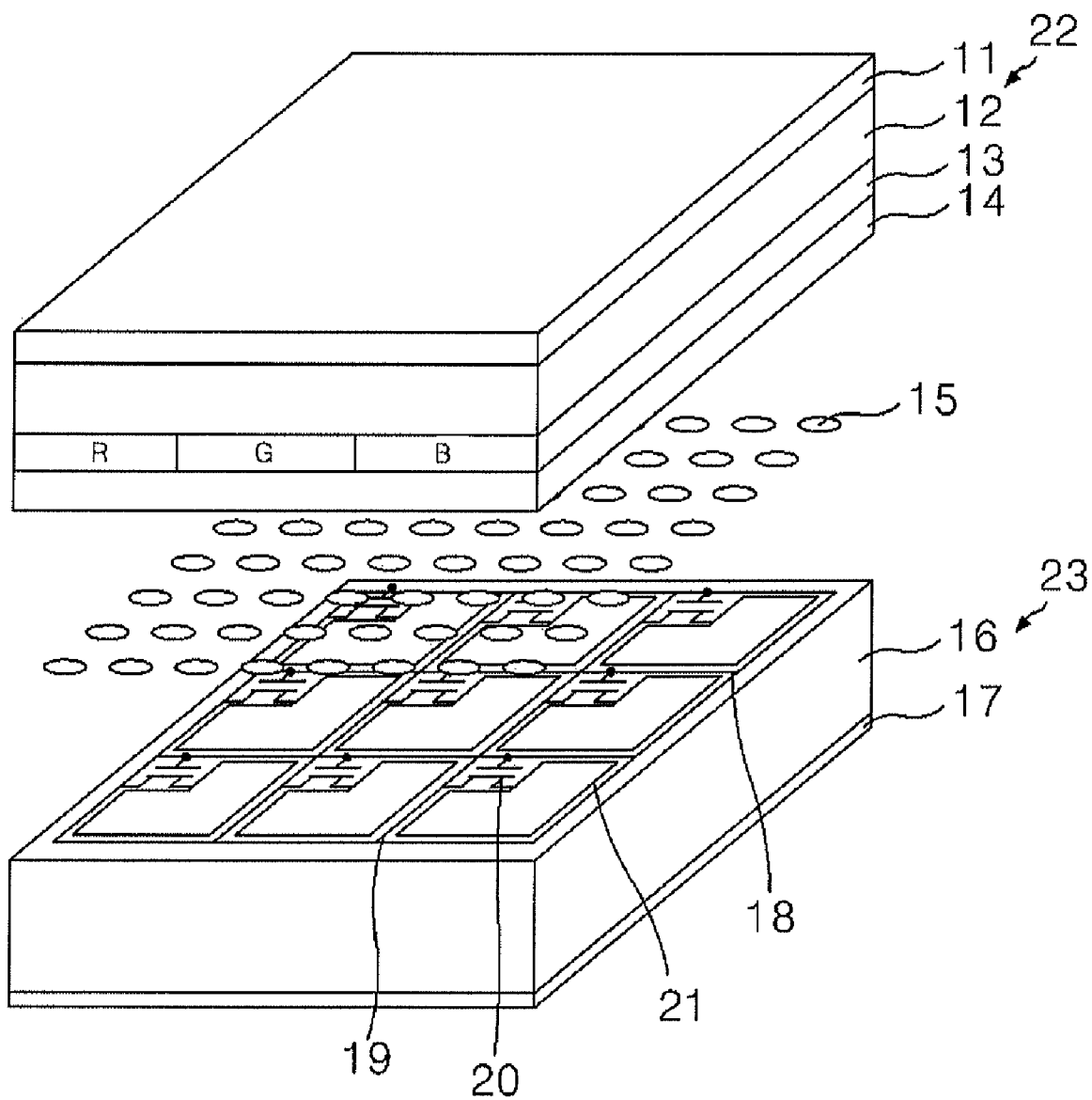
FIG. 1 is a perspective diagram illustrating an active-matrix type LCD device.
Figure 2:
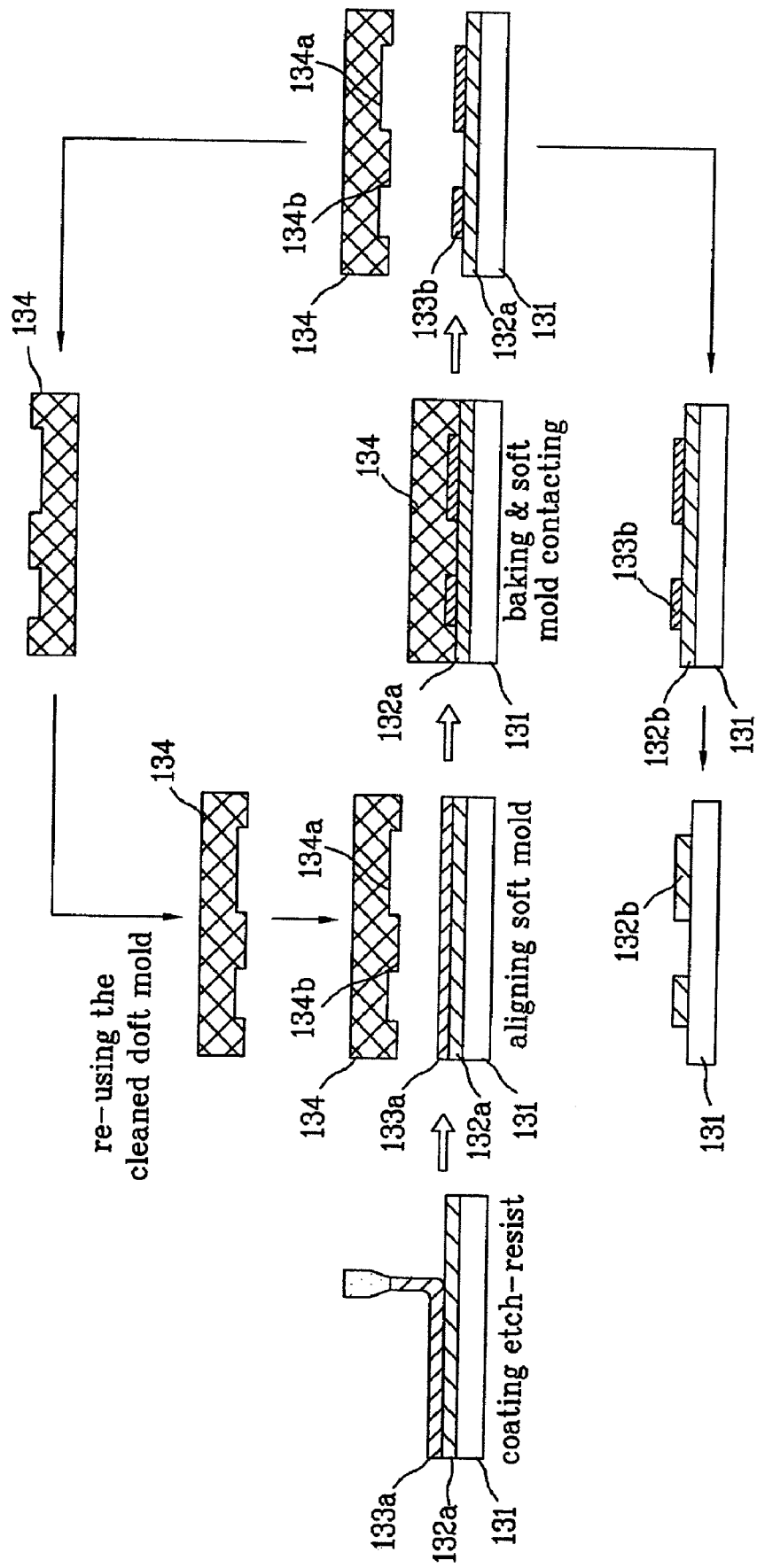
FIG. 2 illustrates an apparatus and method of fabricating a flat panel display device according to the preferred embodiment of the present invention.
Figure 3:
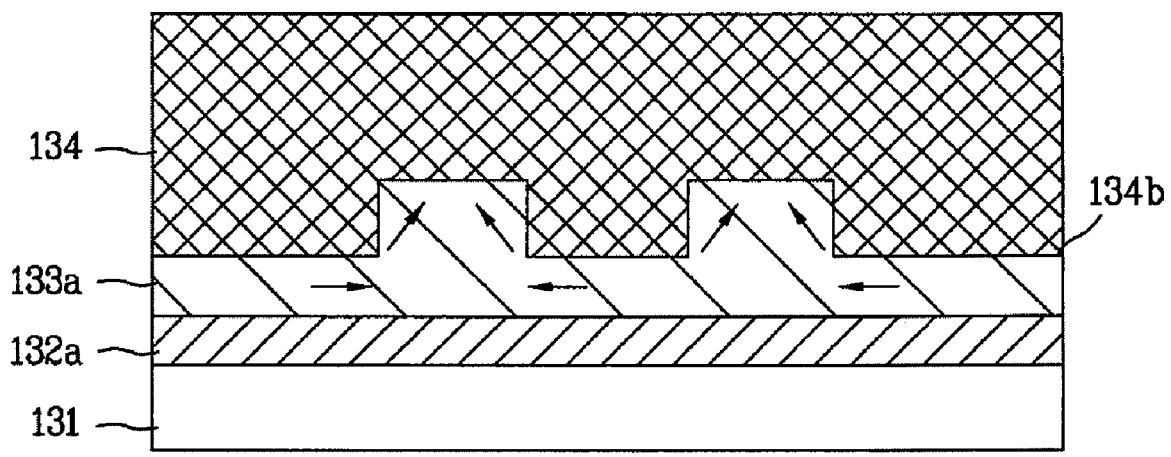
FIG. 3 illustrates movement of etch-resist liquid in a contact between a substrate and a soft mold shown in FIG. 2.

Referring to FIGS. 2 and 3, a method of fabricating a flat panel display device according to the preferred embodiment of the present invention can form a thin film pattern having a desired shape by using a soft mold 134 instead of a related art photoresist pattern process.

A thin film patterning process using the soft mold 134 includes steps of coating etch-resist liquid 133a on a substrate 131 including a thin film 132a; patterning an etch-resist layer by using the soft mold 134; performing an etching for patterning of a thin film 132; stripping remaining etch-resist pattern; and testing. To form the thin film 132a on the substrate 131, a basic material used for a metal pattern, an organic material pattern, and an inorganic material pattern included in an array of the flat panel display device is formed on the substrate 131 by coating or deposition.

The etch-resist liquid 133a includes a main resin of at least any one of liquid pre-polymer and liquid monomer, an activator, an initiator, and thermal flow derivatives. The etch-resist liquid 133a is coated on the thin film 132a by nozzle-spraying or spin-coating.

The soft mold 134 is formed of a rubber material of good elasticity, for example, polydimethylsiloxane PDMS, polyurethane, and cross-linked novolac resin. The soft mold 134 is provided with grooves 134a which correspond to patterns remaining on the substrate 131. The soft mold 134 is provided with the grooves 134a and protruding surfaces 134b. Then, the surface of soft mold 134 is performed with hydrophilic or hydrophobic treatment. Hereinafter, a case using the hydrophobic soft mold 134 will be explained as follows.

After positioning the soft mold 134 above the etch-resist liquid 133a, the soft mold 134 is put on the etch-resist liquid 133a. Thus, the etch-resist liquid 133a is pressurized at a pressure of enabling a contact with the thin film 132a, that is, by a weight of the soft mold 134.

For example, as shown in FIG. 3, the etch-resist liquid 133a moves toward the inside of groove 134a included in the soft mold 134 by a capillary force generated by a pressure between the soft mold 134 and the substrate 131 and a repulsive force between the soft mold 134 and the etch-resist liquid 133a, thereby forming an etch-resist pattern 133b, whose shape is inverted to the pattern of groove 134a included in the soft mold 134, on the thin film 132a. After separating the soft mold 134 from the substrate 131, a wet-etching or dry-etching is carried out. At this time, the etch-resist pattern 133b functions as a mask. Thus, only predetermined portions of the thin film 132a positioned under the etch-resist pattern 133b remain on the substrate 131, and the other exposed portions of the thin film 132a are removed. Then, the etch-resist pattern 134b is removed by stripping, and a test for the short and disconnection of the thin film pattern 132b is performed through an optical test.

After separating the soft mold 134 from the substrate 131, the substrate 131 is cleaned with UV and ozone $O_3$, and then soft mold 134 is re-used in the process for patterning another thin film 132a.

Figure 4:
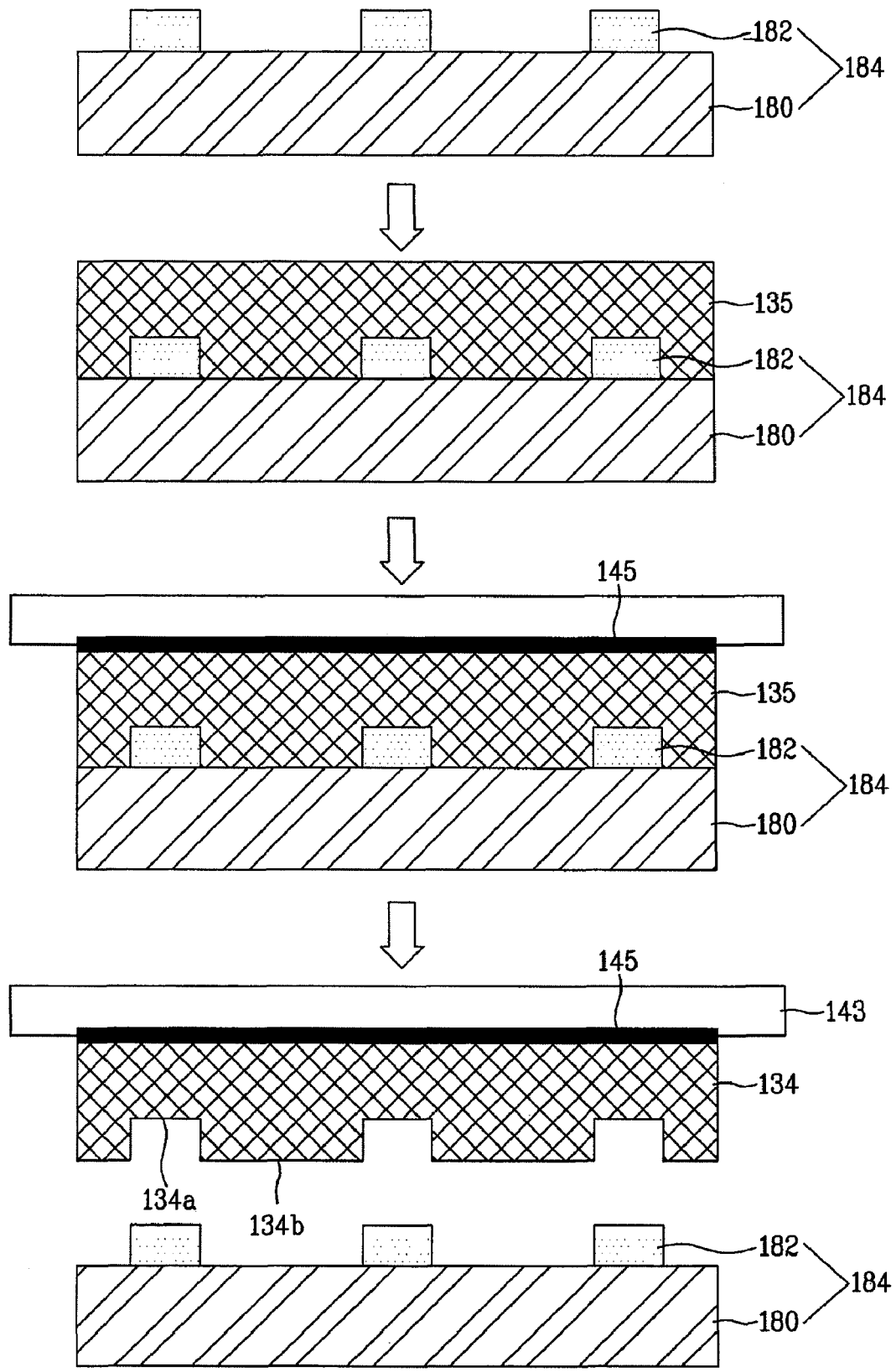
FIG. 4 illustrates an apparatus and method of fabricating a flat panel display device according to the first embodiment of the present invention.

FIG. 4 illustrates an apparatus and method of fabricating a flat panel display device according to the first embodiment of the present invention.

As shown in FIG. 4, a master mold 184 including a photoresist pattern, an inorganic material pattern and a thin film pattern 182 is prepared on a substrate 180. Then, a molding material 135 including polydimethylsolixane PDMS and a small amount of curing agent is coated on the master mold 184 having the thin film pattern 182. Thereafter, the liquid type molding material 135 is maintained at a room temperature (about 25° C.) for one hour to two days. In another method, the molding material 135 coated on the master mold 184 is treated by a thermal curing at a temperature of about 80° C. for one hour, thereby forming the soft mold 134 from which the master mold 184 is not separated.

The mold support plate 143 (or referred to as "backplane") 143 coated with an adhesive 145 is prepared. After the mold support plate 143 adheres closely to the rear surface of the soft mold 134 from which the master mold 184 is not separated in state of positioning the adhesive 145 therebetween, they are maintained for one day (24 hours) to two days, thereby curing the adhesive 145. By means of the adhesive 145, the mold support plate 143 closely adheres to the rear surface of the soft mold 134. At this time, the adhesive 145 may be formed of glycidyl methacrylate mixed with a photo-initiator such as Igarcure 379, or may be formed of butyl methacrylate mixed with a photo-initiator such as Igarcure 379.

As the soft mold 134 is separated from the master mold 184, the soft mold 134 is completed with the grooves which are identical in shape to the thin film pattern 182 of the master mold 184. At this time, the mold support plate 143 prevents the length of soft mold 134 from being decreased. Also, the mold support plate 143 serves as means of separating the soft mold 134 from the master mold 184, and transmitting and stamping means for the soft mold 134. The soft mold fabricated by the aforementioned process is used for forming the thin film pattern of the flat panel display device.

In the process of FIG. 4, the soft mold 134 and the mold support plate 143 are bonded to each other by the adhesive 145, thereby causing problems of increasing fabrication cost and time. Especially, the time of curing the adhesive 143 raises a problem of the increase of time to fabricate the entire soft mold 134.

The second embodiment of the present invention proposes the technology for forming the soft mold 134 and the mold support plate 143 as one body without the use of adhesive. In case of the second embodiment of the present invention, the soft mold 134 is formed of PDMS polymer having a terminal group of Si—H into which a linear oligomer chain is inserted.

A chemical formula for the related art PDMS is $(H_3C)[SiO(CH_3)_2]nSi(CH_3)_3$, and 'n' is the number of monomers $[SiO(CH_3)_2]$. PDMS has a structure where a base part and an X-linker part are bonded at a ratio of 10 to 1.

Figure 5:
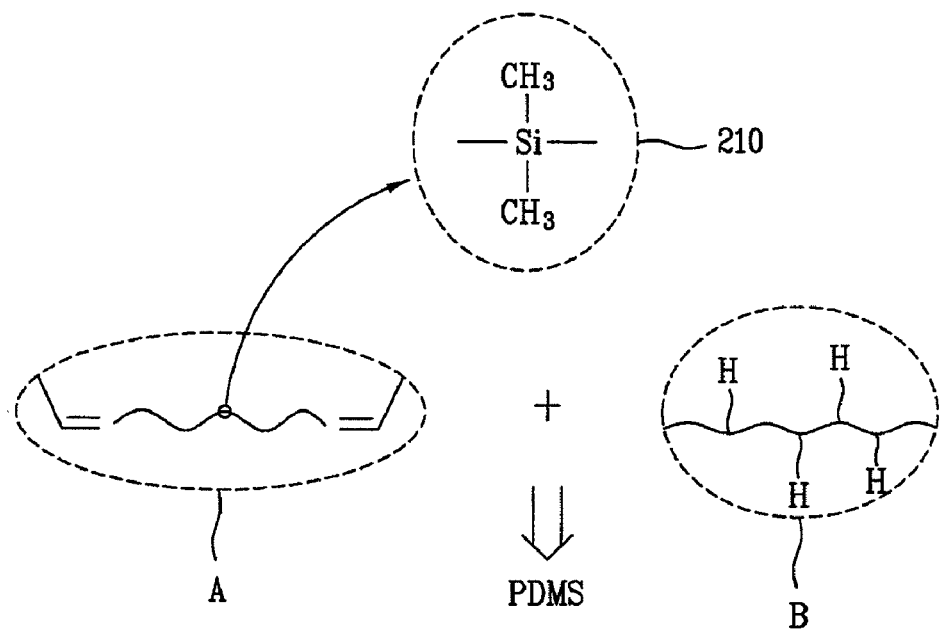
FIG. 5 illustrates a polymer structure of a soft mold shown in FIG. 4.

FIG. 5 illustrates the polymer structure of the related art PDMS. Referring to FIG. 5, the base part A is configured with the monomers linked linearly, and the base part A corresponds to the polymer having the terminal group of Si—H. Also, the X-linker part B is configured with the monomers linked linearly, and the X-linker part B corresponds to the polymer having the monomers, some of which are partially bonded to hydrogen(H). FIG. 5 illustrates a structural formula of $[SiO(CH_3)_2]$ monomer 201.

Figure 6:
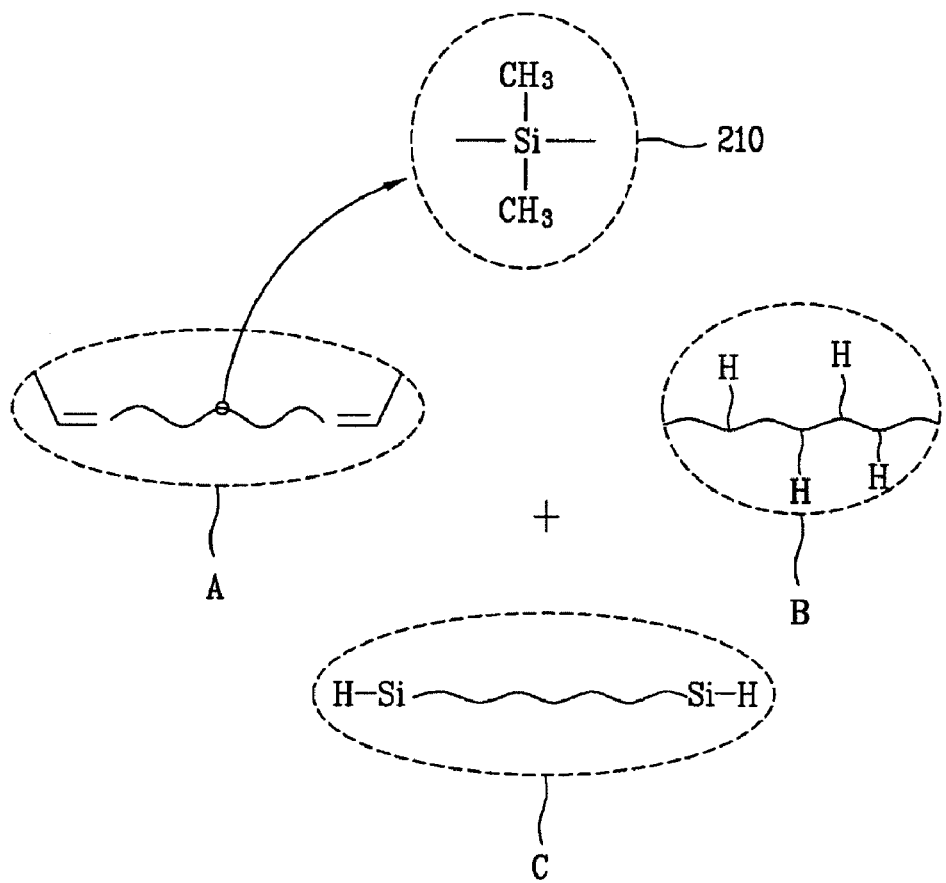
FIG. 6 illustrates a polymer structure of a soft mold according to the second embodiment of the present invention.

The material for the soft mold proposed by the present invention is formed by inserting oligomer having terminal group of Si—H into PDMS polymer of FIG. 5. That is, as shown in FIG. 6, ten or less monomers $[SiO(CH_3)_2]$ are polymerized to PDMS polymer comprised of the base part A and the X-linker part B, and the soft mold is formed by using the molding material to which the oligomer having the terminal group of Si—H is inserted. For example, the soft mold is configured that the base part A, the X-linker part B and the oligomer C are mixed at a ratio of 1:1:1. Through the use of the soft mold having the aforementioned structure, the soft mold 134 is adhered to the mold support plate 143 without the use of adhesive.

Figure 7:
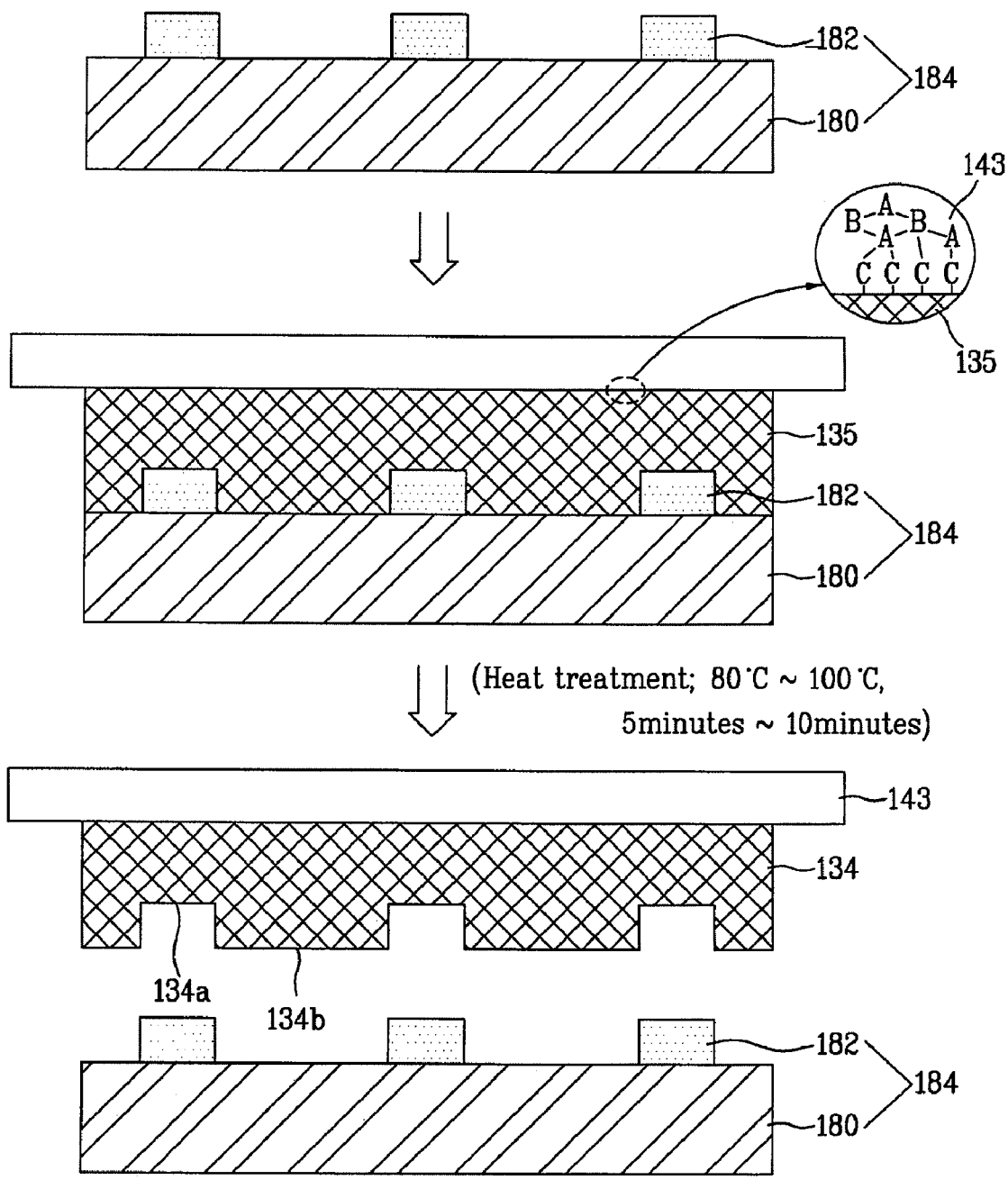
FIG. 7 illustrates an apparatus and method of fabricating a flat panel display device including a soft mold having a polymer structure shown in FIG. 6.

This will be explained with reference to FIG. 7. FIG. 7 illustrates an apparatus and method of fabricating a flat panel display device according to the second embodiment of the present invention.

First, a master mold 184 including a photoresist pattern, an inorganic material pattern and a thin film pattern 182 is prepared on a substrate 180. After that, a molding material 135 is coated on the master mold 184 including the thin film pattern 182, wherein the molding material 135 is formed by adding oligomer having a terminal group of Si—H to PDMS comprised of a base part A and an X-linker part B.

Thereafter, the liquid type molding material 135 is maintained at a room temperature (about 25° C.) for one hour to two days. In another method, the molding material 135 coated on the master mold 184 is treated by a thermal curing at a temperature of about 80° C. for one hour, thereby forming the soft mold 134 from which the master mold 184 is not separated.

After preparing a mold support plate 143, the mold support plate 143 adheres closely to the rear surface of the soft mold 134 which is not separated from the master mold 184, and a heat treatment of 80° C. to 100° C. is performed at a period of 5 minutes to 20 minutes. Thus, there is the strong covalent bonding between the interface of mold support plate 143 corresponding to a glass substrate and the oligomer C of the soft mold 134.

Figure 8:
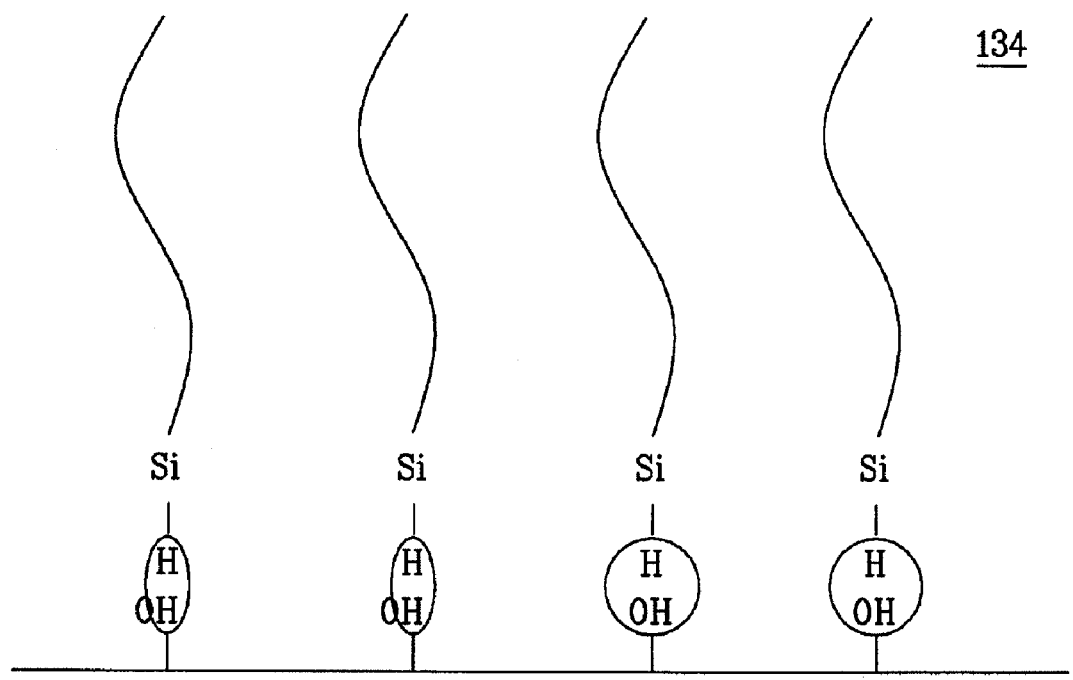
FIG. 8 illustrates a chemical reaction in a contact area between a soft mold and a mold support plate.

FIG. 8 illustrates the covalent bonding between the oligomer C and the interface of mold support plate 143. Referring to FIG. 8, the mold support plate 143 is configured that hydroxyl radical (OH) is positioned in the interface of mold support plate 143 and Si—H is positioned in the terminal group of oligomer C. Accordingly, there is the strong covalent bonding between hydroxyl radical (OH) and H(hydrogen) at the terminal group of oligomer C, or between H(hydrogen) of hydroxyl radical (OH) and H(hydrogen) at the terminal group of oligomer C. As a result, the soft mold 134 is adhered to the mold support plate 143 without an additional adhesive.

Figure 9:
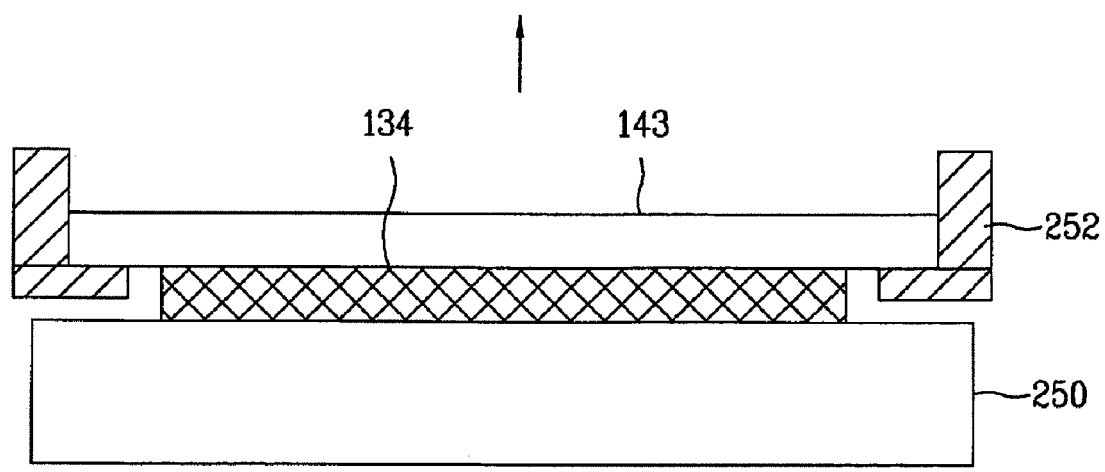
FIG. 9 illustrates a process of testing an adhesive strength between a mold support plate and a soft mold being adhered to each other.

An applicant of the present invention checks the adhesive strength between the soft mold 134 and the mold support plate 143 through the following experimental results of FIG. 9. The applicant performs the experiment to forcibly separate the soft mold 134 from the mold support plate 143 by using a holder 252 after loading the mold support plate 143 having the soft mold 134 being adhered thereto on a vacuum stage 250. On assumption that the soft mold 134 is adhered to the mold support plate 143 by using the related art adhesive, the soft mold 134 and the mold support plate 143 are separated from each other when a vacuum level of $10^{-2}$ torr and a speed level of 0.01 mm/s are applied to the vacuum stage 250 having the soft mold 134 and the mold support plate 143 loaded thereon. Meanwhile, on assumption that the soft mold 134 is adhered to the mold support plate 143 by the covalent bonding proposed in the second embodiment of the present invention, the soft mold 134 and the mold support plate 143 are not separated from each other even though a vacuum level of $10^{-2}$ torr and a speed level of 0.01 mm/s are applied to the vacuum stage 250 having the soft mold 134 and the mold support plate 143 loaded thereon. At this time, a heat treatment for contacting the soft mold 134 and the mold support plate 143 is performed at a temperature of 80° C. for 5 minutes.

FIG. 10 illustrates a photograph showing PDMS and oligomor which spread to the mold support plate after separating the mold support plate from the soft mold. That is, FIG. 10 shows that the soft mold 134 and the mold support plate 143 can be adhered to each other without the additional adhesive.

The apparatus and method for fabricating the flat panel display device according to the second embodiment of the present invention can adhere the soft mold 134 to the mold support plate 143 by the covalent bonding in the interface between the soft mold 134 and the mold support plate 143. As a result, the fabrication process of the flat panel display device can be simplified and the fabrication cost of the flat panel display device can be reduced.

The apparatus and method for fabricating the flat panel display device according to the present invention can be applied to a process for patterning an electrode layer, an organic material layer and an inorganic material layer included in flat panel display devices such as a field emission display FED, a plasma display panel PDP, and an electroluminescent device EL.

As mentioned above, the apparatus and method for fabricating the flat panel display device according to the present invention has the following advantages.

The method for fabricating the flat panel display device according to the present invention can perform the patterning process without the use of photo process, thereby simplifying the fabrication process of the flat panel display device.

In the apparatus and method for fabricating the flat panel display device according to the present invention, ten or less monomers [SiO(CH$_3$)$_2$] are polymerized to PDMS polymer comprised of the base part and the X-linker part, and the soft mold is formed by using the molding material to which the oligomer having the terminal group of Si—H is inserted. Without the additional adhesive, the soft mold is closely adhered to the mold support plate owing to the covalent bonding in the interface between the soft mold and the mold support plate. As a result, there is no necessary for the process to provide the adhesive and to cure the provided adhesive, thereby simplifying the fabrication process and reducing the fabrication cost.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating an apparatus of fabricating flat panel display device comprising:
   preparing a master mold including a thin film pattern;
   coating a liquid-type molding material including oligomer on the master mold;
   forming a soft mold including a groove provided with a pattern in a shape corresponding to the thin film pattern of the master mold;
   placing a mold support plate on the soft mold; and
   heat-treating the soft mold and the mold support plate to cause a covalent bonding in the interface between the oligomer in the soft mold and the mold support plate such that the soft mold is bonded to the mold support plate without using an adhesive,
   wherein the oligomer includes monomers [SiO(CH$_3$)$_2$] polymerized linearly, and a terminal group of Si—H; and
   wherein the covalent bonding occurs between hydroxyl radical (OH) and H(hydrogen) at the terminal group of oligomer, or between H(hydrogen) of hydroxyl radical (OH) and H(hydrogen) at the terminal group of oligomer.

2. The method of claim 1, wherein the soft mold is comprised of a base part which includes monomers [SiO(CH$_3$)$_2$] linked linearly and a terminal having a vinyl-group bonded thereto; an X-linker part which includes monomers [SiO(CH$_3$)$_2$] linked linearly, and some of the monomers have hydrogen(H) bonded thereto; and a material mixed with the oligomer.

3. The method of claim 1, wherein a heat treatment of 80° C. to 100° C. is applied for 5 minutes to 20 minutes in state of that the soft mold is brought into contact with the mold support plate.

4. A method of fabricating a flat panel display device using method for fabricating an apparatus provided with preparing a master mold including a thin film pattern, coating a liquid-type molding material including oligomer on the master mold, forming a soft mold including a groove provided with a pattern in a shape corresponding to the thin film pattern of the master mold, and adhering the soft mold to a mold support plate, comprising:
   coating an etch-resist liquid on a substrate including a thin film;
   positioning the soft mold above the substrate coated with the etch-resist liquid, and patterning an etch-resist layer by using the soft mold;
   patterning the thin film by using the patterned etch-resist layer;
   removing the etch-resist layer; and
wherein the oligomer includes monomers [SiO(CH$_3$)$_2$] polymerized linearly, and a terminal group of Si—H, and wherein adhering the soft mold to the mold support plate comprises heat-treating the soft mold and the mold support plate to cause a covalent bonding in the interface between the oligomer in the soft mold and the mold support plate such that the soft mold is directly bonded to the mold support plate without using an adhesive, wherein the covalent bonding occurs between hydroxyl radical (OH) and H(hydrogen) at the terminal group of oligomer, or between H(hydrogen) of hydroxyl radical (OH) and H(hydrogen) at the terminal group of oligomer.

* * * * *